(12) United States Patent
Kim

(10) Patent No.: US 8,598,613 B2
(45) Date of Patent: Dec. 3, 2013

(54) LIGHT EMITTING DEVICE COMPRISING AN ELECTRODE WITH PERFORATION PATTERN

(75) Inventor: Jun Hyoung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 163 days.

(21) Appl. No.: 12/938,703

(22) Filed: Nov. 3, 2010

(65) Prior Publication Data

US 2011/0108872 A1    May 12, 2011

(30) Foreign Application Priority Data

Nov. 12, 2009    (KR) .................. 10-2009-0109053

(51) Int. Cl.
*H01L 33/00*    (2010.01)

(52) U.S. Cl.
USPC    257/99; 257/98; 257/E33.065; 257/E33.074; 438/29

(58) Field of Classification Search
USPC .............. 257/98, 99, E33.065, E33.068, 257/E33.074; 438/29
See application file for complete search history.

(56) References Cited

U.S. PATENT DOCUMENTS

| | | | |
|---|---|---|---|
| 6,194,241 B1 * | 2/2001 | Tsutsui et al. .............. | 438/46 |
| 7,057,210 B2 * | 6/2006 | Miki et al. .............. | 257/91 |
| 7,501,665 B2 * | 3/2009 | Yasuda et al. .............. | 257/98 |
| 7,884,376 B2 * | 2/2011 | Lu et al. .............. | 257/81 |
| 2005/0179130 A1 * | 8/2005 | Tanaka et al. .............. | 257/730 |
| 2007/0170840 A1 | 7/2007 | Chang-Hae et al. | |
| 2008/0105881 A1 * | 5/2008 | Kim et al. .............. | 257/76 |
| 2008/0230791 A1 * | 9/2008 | Lin et al. .............. | 257/91 |
| 2009/0272994 A1 | 11/2009 | Lim .............. | 257/97 |
| 2010/0062554 A1 * | 3/2010 | Kim .............. | 438/29 |
| 2011/0092055 A1 | 4/2011 | Kim et al. .............. | 438/478 |

FOREIGN PATENT DOCUMENTS

| | | |
|---|---|---|
| CN | 101271953 | 9/2008 |
| EP | 1 667 241 A1 | 6/2006 |
| KR | 10-2008-0041338 A | 5/2008 |
| KR | 10-2009-0076164 A | 7/2009 |
| KR | 10-2010-0030472 A | 3/2010 |

OTHER PUBLICATIONS

Korean Office Action dated Apr. 7, 2011 issued in Application No. 10-2009-0109053.
Korean Office Action dated Nov. 14, 2011 issued in Application No. 10-2009-0109053.
European Search Report dated Dec. 21, 2011 issued in Application No. 10 18 9259.
Chinese Office Action dated Jul. 20, 2012.

* cited by examiner

*Primary Examiner* — John C Ingham
(74) *Attorney, Agent, or Firm* — KED & Associates LLP

(57) ABSTRACT

A light emitting device according to the embodiment includes a substrate; a buffer layer over the substrate; an electrode including a perforation pattern through top and bottom surfaces of the electrode over the buffer layer; a first semiconductor layer over the electrode; an active layer over the first semiconductor layer; and a second semiconductor layer over the active layer. The first semiconductor layer extends onto a top surface of the perforation pattern by passing through the perforation pattern while making contact with the buffer layer.

20 Claims, 11 Drawing Sheets

LIGHT EMITTING DEVICE COMPRISING AN ELECTRODE WITH PERFORATION PATTERN

The present application claims priority under 35 U.S.C. §119(a) of Korean Patent Application No. 10-2009-0109053 filed on Nov. 12, 2009, which is hereby incorporated by reference in its entirety.

BACKGROUND

The embodiment relates to a light emitting device and a light emitting device package.

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by employing phosphors or combining LEDs having various colors.

In order to improve the brightness and the performance of the LED, various attempts have been performed to improve a light extracting structure, an active layer structure, current spreading, an electrode structure, and a structure of a light emitting diode package.

SUMMARY

The embodiment provides a light emitting device capable of improving the light extraction efficiency.

The embodiment provides a light emitting device capable of improving the quality and reliability thereof.

The embodiment provides a light emitting device, which can be manufactured through a simple process.

The embodiment provides a light emitting device having the superior current spreading effect.

The embodiment provides a light emitting device package including such a light emitting device.

A light emitting device according to the embodiment includes a substrate; a buffer layer over the substrate; an electrode including a perforation pattern formed through top and bottom surfaces of the electrode over the buffer layer; a first semiconductor layer over the electrode; an active layer over the first semiconductor layer; and a second semiconductor layer over the active layer, wherein the first semiconductor layer extends onto a top surface of the perforation pattern while making contact with the buffer layer.

A light emitting device according to the embodiment includes a substrate; a buffer layer over the substrate; an electrode including a perforation pattern formed through top and bottom surfaces of the electrode over the buffer layer; a first semiconductor layer over the electrode; an active layer over the first semiconductor layer; and a second semiconductor layer over the active layer, wherein the perforation pattern includes: a plurality of first protrusions extending from one side of the perforation pattern; and a plurality of second protrusions extending from an opposite side of the perforation pattern in opposition to the first protrusions, and wherein a width between the first and second protrusions corresponds to a half or less of a wavelength of light emitted from the active layer.

A light emitting device package according to the embodiment includes a body; first and second electrode layers over the body; a light emitting device electrically connected to the first and second electrodes over the body; and a molding member surrounding the light emitting device over the body, wherein the light emitting device includes: a buffer layer over a substrate; an electrode including a perforation pattern formed through top and bottom surfaces of the electrode over the buffer layer; a first semiconductor layer over the electrode; an active layer over the first semiconductor layer; and a second semiconductor layer over the active layer, and wherein the first semiconductor layer extends onto a top surface of the perforation pattern by passing through the perforation pattern while making contact with the buffer layer.

DETAILED DESCRIPTION OF THE EMBODIMENTS

Figure 1:
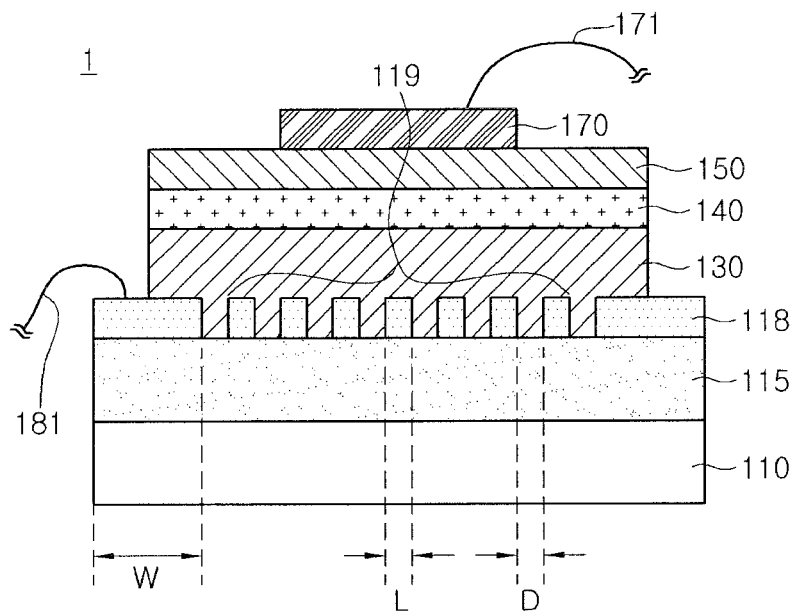
FIG. 1 is a sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with reference accompanying drawings. The thickness and size of each layer shown in the drawings may be exaggerated, omitted or schematically drawn for the purpose of convenience or clarity. In addition, the size of elements does not utterly reflect an actual size.

Figure 2:
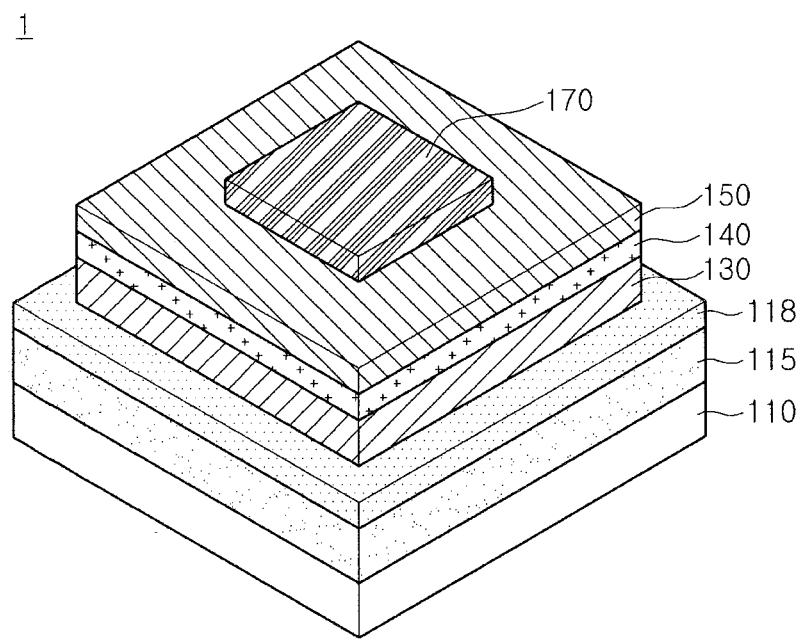
FIG. 2 is a perspective view of a light emitting device shown in FIG. 1.

FIG. 1 is a sectional view showing a light emitting device according to the first embodiment, and FIG. 2 is a perspective view of the light emitting device shown in FIG. 1.

Referring to FIGS. 1 and 2, the light emitting device 1 includes a substrate 110, a buffer layer 115, a first electrode 118, a first semiconductor layer 130, an active layer 140, a second semiconductor layer 150, and a second electrode 170.

The substrate 110 may include at least one selected from the group consisting of $Al_2O_3$, SiC, Si, GaAs, GaN, ZnO, Si, GaP, InP, and Ge.

A buffer layer 115 can be formed on the substrate 110 to reduce lattice mismatch between the substrate 110 and the first semiconductor layer 130.

The buffer layer 115 may include semiconductor materials having the compositional formula of $In_xAl_yGa_{1-x-y}N$ ($0 \leq x \leq 1$, $0 \leq y \leq 1$, $0 \leq x+y \leq 1$). For instance, the buffer layer 115 may include one of InAlGaN, GaN, AlGaN, InGaN, AlInN, AlN, and InN. It is not limited to these materials.

A first electrode 118 may be formed on the buffer layer 115.

In the meantime, the first electrode 118 can be formed on the first semiconductor layer 130 after a portion of the first semiconductor layer 130 has been formed on the buffer layer 115. In addition, the first electrode 118 can be formed on the substrate 110 without forming the buffer layer 115, and the embodiment is not limited thereto. According to the embodiment, it will be described in detail that the first electrode 118 is formed on the buffer layer 115.

The first electrode 118 includes a material having electric conductivity. For instance, the first electrode 118 may include polysilicon, metal, or an alloy. The embodiment does not limit the material for the first electrode 118.

The polysilicon has electric conductivity and a high melting point (1400° C. or above), oxidative stability, low-temperature stability and fire-resistant property, so that the polysilicon may make the first electrode 118 form stably.

In the meantime, the polysilicon can be doped with conductive dopant to improve the electric conductivity, but the embodiment is not limited thereto.

Preferably, a metal having a high melting point is used for the first electrode 118. For instance, the first electrode 118 may include at least one of Pt, Cr, Mo, Ti, Ta, and W.

Preferably, an alloy having a high melting point is used for the first electrode 118. For instance, the first electrode 118 may include $TiSi_2$ or $WSi_2$.

The first electrode 118 may include a perforation pattern 119. The perforation pattern 119 can be formed by selectively removing the first electrode 118. The perforation pattern 119 is formed through the top and bottom surfaces of the first electrode 118 such that at least a portion of the buffer layer 115 can be exposed. Since the buffer layer 115 is exposed through the perforation pattern 119, for instance, the first semiconductor layer 130 can be grown on the buffer layer 115 and the first electrode 118 through the ELO (epitaxy lateral overgrowth) process. In detail, when the first semiconductor layer 130 is grown, the buffer layer 115, which is exposed through the perforation pattern 119 of the first electrode 118, may serve as a seed layer.

An area of the buffer layer 115 exposed through the perforation pattern 119 can be variously adjusted according to the manufacturing process for the first semiconductor layer 130, and the embodiment is not limited thereto.

The perforation pattern 119 may have various shapes. Since power is supplied to the light emitting device 1 through the first electrode 118, the perforation pattern 119 is designed such that current can be uniformly distributed over the whole area of the first electrode 118 without being concentrated onto a specific spot of the first electrode 118. In this case, the current spreading effect of the light emitting device 1 can be improved.

The first semiconductor layer 130 extends onto the top surface of the first electrode 118 through the perforation pattern 119. In detail, the first semiconductor layer 130 keeps to be grown from the buffer layer 115 such that the first semiconductor layer 130 can be formed on the top surface of the first electrode 118 through the perforation pattern 119.

Figure 6:
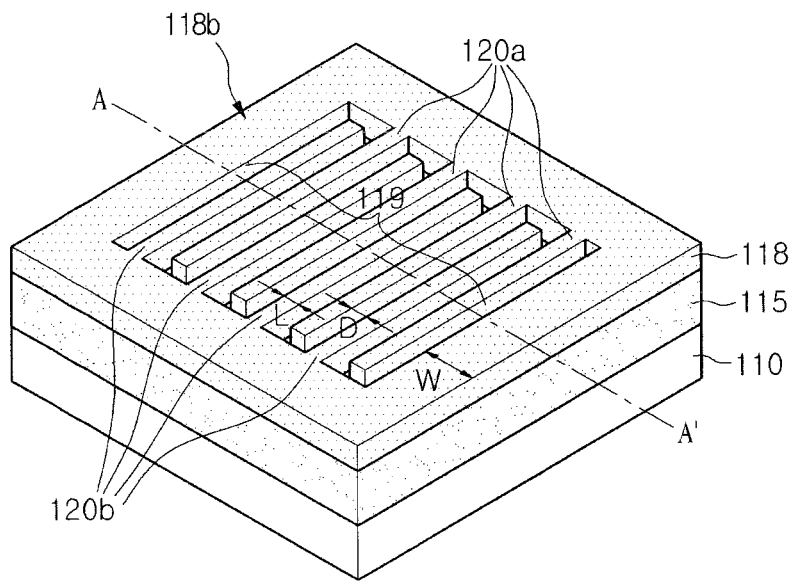

Referring to FIG. 6, the perforation pattern 119 includes a plurality of first and second protrusions 120a and 12b, which protrude in the form of a comb such that they are alternately arranged with each other. The first protrusions 120a protrude in the first horizontal direction and the second protrusions 120b protrude in the second horizontal direction opposite to the first horizontal direction.

Figure 8:
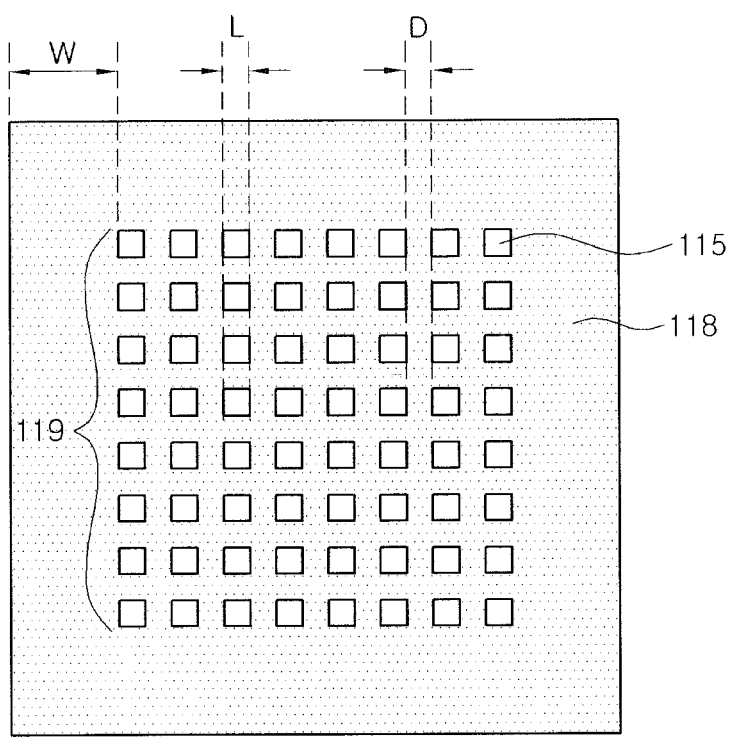
FIG. 8 is a view showing an example of a perforation pattern formed in a light emitting device according to the first embodiment.

Referring to FIG. 8, the perforation pattern 119 may include a net structure or a dot matrix structure. That is, the perforation pattern 119 may include a plurality of dot rows and a plurality of dot columns arranged in the dot matrix. Each dot is a through hole formed through the top and bottom surface of the first electrode 118 and a plurality of dots are formed in the first electrode 118 in the dot matrix. When viewed from the top, the dot includes a rectangular shape, but the embodiment is not limited thereto. For instance, the dot may include a circular shape, an oval shape, a lozenge shape, a diamond shape or a star shape.

Figure 9:
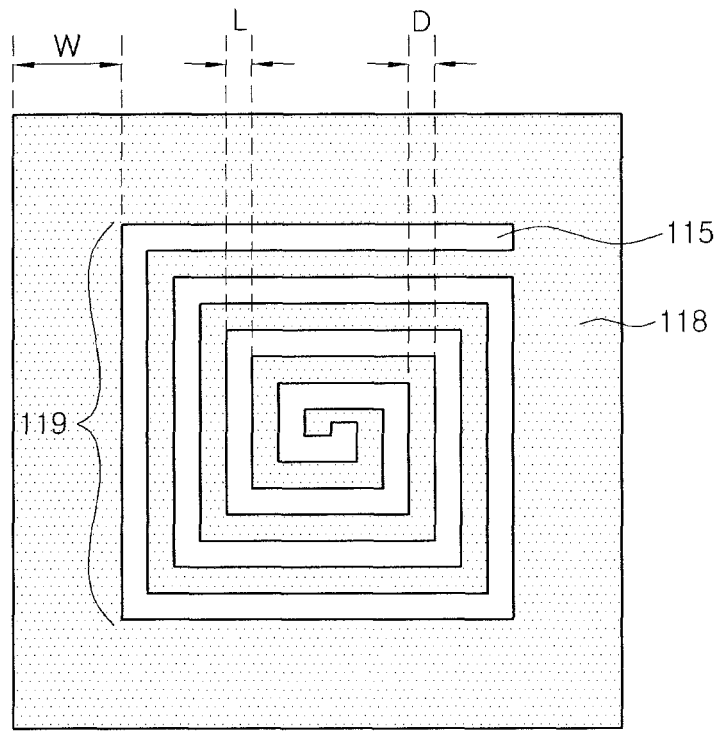
FIG. 9 is a view showing another example of a perforation pattern formed in a light emitting device according to the first embodiment.

Referring to FIG. 9, the perforation pattern 119 may include a spiral shape. However, the embodiment does not limit the shape of the perforation pattern 119. The perforation pattern 119 spirally extends from the center of the first electrode 118 to the outer peripheral region of the first electrode 118. That is, the perforation pattern 118 include the spiral structure between the center of the first electrode 118 and the outer peripheral region 118b of the first electrode 118.

Referring again to FIG. 6, a width of each of the first and second protrusions 120a and 120b may be defined as L (hereinafter, referred to as a first width), and an interval between the first and second protrusions 120a and 120b may be defined as D (hereinafter, referred to as a second width). Each of the first and second protrusions 120a and 120b may be defined as non-exposure region which does not expose the buffer layer 115, and gaps between the first and second protrusions 120a and 120b may be defined as exposure regions for exposing the buffer layer 115.

The perforation pattern 119 has first and second widths L and D respectively designed to be a half or less of the wavelength of light emitted from the active layer 140. That is, the first and second widths L and D are designed to satisfy the equation: L or $D \leq \lambda/2$.

For instance, if the active layer 140 emits blue light having the wavelength of 450 nm to 500 nm, each of the first and second widths L and D have a size of about 200 nm to 250 nm, respectively.

Since the perforation pattern 119 has the first and second widths L and D respectively designed to be a half or less of the wavelength of light emitted from the active layer 140, the light incident into the perforation pattern 119 from the active layer 140 is reflected without transmitting through the buffer layer 115. Therefore, light loss can be minimized and the light reflectance efficiency can be maximized, so that the light extraction efficiency of the light emitting device 1 can be remarkably improved.

In more detail, the light emitted from the active layer 140 may have polarizing components directed in various directions (for instance, first direction (x) and second direction (y)). For example, the polarizing component directed in the second direction (y) may proceed in a lengthwise direction along each of the first and second protrusions 120a and 120b, which are alternately arranged with each other, and the polarizing component directed in the first direction (x) may proceed perpendicularly to the first and second protrusions 120a and 120b.

Therefore, if the perforation pattern 119 include the first and second widths L and D designed to be a half or less of the wavelength of light emitted from the active layer 140, the polarizing component directed in the first direction (x) may be totally reflected from the perforation pattern 118, so that the light extraction efficiency can be remarkably improved.

The perforation pattern 119 can be formed over the whole area of the first electrode 118 except for the outer peripheral region 118b of the first electrode 118 having a third width W from an outer end of the first electrode 118.

Figure 7:
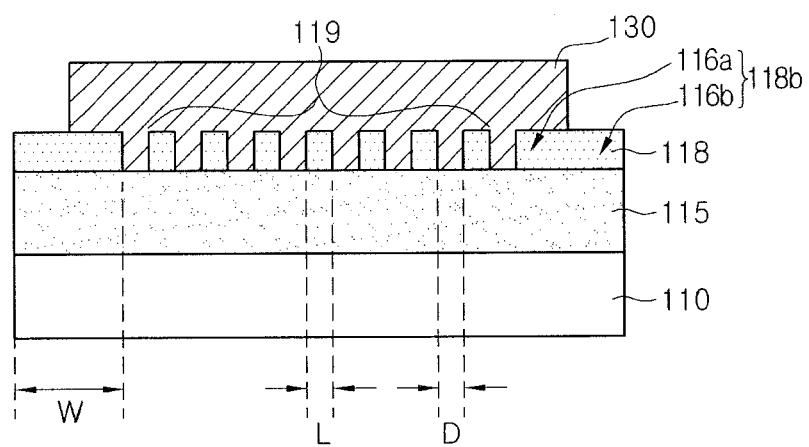
FIG. 7 is a sectional view showing a first semiconductor layer formed on a first electrode of FIG. 1.

Referring to FIG. 7, since the first semiconductor layer 130 must not be formed on a second region 116b of the outer peripheral region 118b, the third width W is relatively larger than those of the first and second widths L and D. For instance, the third width W is about 30 μm to 50 μm.

The first semiconductor layer 130 formed on the buffer layer 115 and the first electrode 118 may be formed over the whole area of the first electrode 118 except for the second region 116b of the outer peripheral region 118b of the first electrode 118.

The formation of the first semiconductor layer 130 may vary depending on the shape or formation location of the perforation pattern 119, and the embodiment is not limited thereto.

In detail, for example, if the first semiconductor layer 130 is formed through the ELO process, the first semiconductor layer 130 may be vertically and/or laterally grown by varying process conditions, such as the temperature or pressure.

That is, if the first semiconductor layer 130 is grown between the first and second protrusions 120a and 120b of the first electrode 118, the temperature and pressure are set suitably for the vertical growth. In addition, if the first semiconductor layer 130 is grown on the first electrode 118, the temperature and pressure are set suitably for the lateral growth.

However, since the first semiconductor layer 130 may not be laterally grown beyond the outer peripheral region 118B having the third width W, the first semiconductor layer 130 may be formed only on a first region 116a of the outer peripheral region 118b without being formed over the whole area of the outer peripheral region 118b.

The first region 116a of the outer peripheral region 118b refers to a region adjacent to the perforation pattern 119, and the second region 116b of the outer peripheral region 118b refers to a region adjacent to the side end of the first electrode 118.

In the meantime, the perforation pattern 119 having the first and second widths L and D is located within the range of the lateral growth of the first semiconductor layer 130, the first semiconductor layer 130 may vertically grow between the first and second protrusions 120a and 120b by using the buffer layer 115 as a seed layer, and then laterally grow on the first and second protrusions 120a and 120b.

Therefore, the first semiconductor layer 130 can be formed between the first and second protrusions 120a and 120b, on the first and second protrusions 120a and 120b, and on the first region 116a of the outer peripheral region 118b. The first semiconductor layer 130 can be formed between the first and second protrusions 120a and 120b while making contact with the buffer layer 115. However, the first semiconductor layer 130 is not formed on the second region 116b of the outer peripheral region 118b.

Since the first semiconductor layer 130 is formed over the whole area of the first electrode 118 except for the second region 116b of the outer peripheral region 118b, the second region 116b of the outer peripheral region 118b of the first electrode 118 is exposed to the outside. Thus, the wire can be easily attached to the second region 116b of the outer peripheral region 118b of the first electrode 118, so that the light emitting device 1 may easily receive power through the first electrode 118.

The first semiconductor layer 130 can be formed on the buffer layer 115 and the first electrode 118. At this time, as described above, the first semiconductor layer 130 can be formed over the whole area of the first electrode 118 except for the second region 116b of the outer peripheral region 118b formed on the top surface of the first electrode 118.

For instance, the first semiconductor layer 130 can be formed through the ELO process. In more detail, the first semiconductor layer 130 may vertically grow through the perforation pattern 119 of the first electrode 118 and then laterally grow on the first electrode 118.

The first semiconductor layer 130 may partially make contact with the buffer layer 115. In detail, only the region of the first semiconductor layer 130 exposed through the perforation pattern 119 of the first electrode 118 makes contact with the buffer layer 115.

Thus, when comparing with the case where the first electrode 118 is not formed, the defect or dislocation caused by the lattice mismatch between the first semiconductor layer 130 and the buffer layer 115 can be reduced.

The first semiconductor layer 130 may exclusively include conductive semiconductor layer, or may further include a non-conductive semiconductor layer under the conductive semiconductor layer, but the embodiment is not limited thereto.

The non-conductive semiconductor layer is not doped with the conductive dopant, so the non-conductive semiconductor layer has electric conductivity significantly lower than that of the conductive semiconductor layer and the second semiconductor layer 150. For instance, the non-conductive semiconductor layer may include an undoped GaN layer, but the embodiment is not limited thereto.

For instance, the first semiconductor layer may include an n type semiconductor layer. The n type semiconductor layer may include semiconductor material having the compositional formula of $In_xAl_yGa_{1-x-y}N$ ($0 \leq x \leq 1$, $0 \leq y \leq 1$, $0 \leq x+y \leq 1$). For instance, the n type semiconductor layer may include one selected from the group consisting of InAlGaN, GaN, AlGaN, InGaN, AlInN, AlN, and InN. In addition, the n type semiconductor layer may include n type dopant, such as Si, Ge or Sn.

The active layer 140 is formed on the first semiconductor layer 130.

Electrons (or holes) injected through the first semiconductor layer 130 is combined with holes (or electrons) injected through the second semiconductor layer 150 at the active layer 140, so that the active layer 140 emits the light having the wavelength corresponding to a band gap according to energy band of intrinsic material of the active layer 140.

The active layer 140 may have the MQW (multiple quantum well) structure or the single quantum well structure, but the embodiment is not limited thereto.

The active layer 140 can be prepared as a stack structure of well/barrier layers by using group III-V compound semiconductor materials including GaN, InGaN, or AlGaN. For instance, the active layer 114 may have a stack structure of InGaN well/GaN barrier layers, InGaN well/AlGaN barrier layers, or InGaN well/InGaN barrier layers. The band gap of the barrier layer is larger than that of the well layer.

A clad layer (not shown) doped with the n type or p type dopant can be formed on and/or under the active layer 140. The clad layer may include an AlGaN layer or an InAlGaN layer.

The second semiconductor layer 150 is formed on the active layer 140. For instance, the second semiconductor layer 150 includes a p type semiconductor layer doped with the p type dopant. The p type semiconductor layer may include semiconductor material having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the p type semiconductor layer may include p type dopant such as Mg, Zn, Ca, Sr, or Ba.

The first semiconductor layer 130, the active layer 140 and the second semiconductor layer 150 may constitute the light emitting structure.

The second electrode 170 is formed on the second semiconductor layer 150. The second electrode 170, together with the first electrode 118, supplies power to the light emitting device 1. The second electrode 170 may perpendicularly overlap with portions of the perforation pattern 119.

A transparent electrode layer (not shown) or a reflective layer (not shown) can be formed between the second semiconductor layer 150 and the second electrode 170.

The transparent electrode layer may include at least one selected from the group consisting of ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au, and Ni/$IrO_x$/Au/ITO, but the embodiment is not limited thereto. The reflective layer can be prepared as a single layer or a multiple layer by using one selected from the group consisting of Ag, Ni, Al, Rh, Pd, Ir, Ru, Mg, Zn, Pt, Au, Hf and an alloy thereof.

A first wire 171 is connected to the second electrode 170 and a second wire 181 is connected to the second region 116b of the outer peripheral region 118b of the first electrode 118. The first and second wires 171 and 181 are connected to the external power source to supply power to the first and second electrodes 118 and 170.

The second region 116b of the outer peripheral region 118b of the first electrode 118 may have a sufficient width and a sufficient area such that the second wire 181 can be easily connected to the second region 116b.

Figure 10:
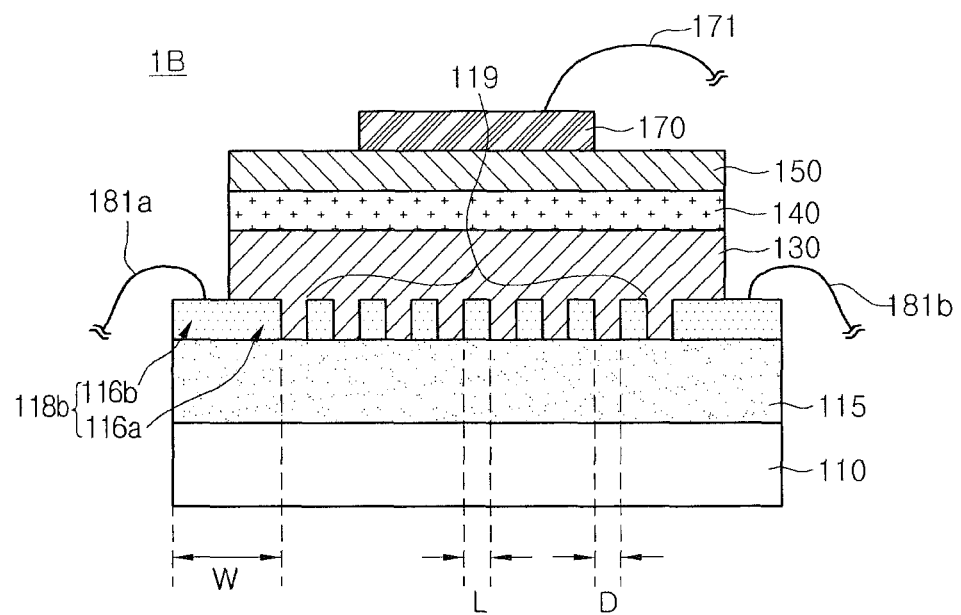
FIG. 10 is a sectional view showing a plurality of second wires formed in a light emitting device according to the first embodiment.

Referring to FIG. 10, in the light emitting device 1B according to another embodiment, a plurality of second wires 181a and 181b can be connected to the second region 116b of the outer peripheral region 118b of the first electrode 118, but the embodiment is not limited thereto. Thus, the power can be easily transferred to the whole area of the first electrode 118, so that the current characteristic and the brightness of the light emitting device 1 can be improved.

The light emitting device 1 can receive power through the first electrode 118 without forming a separate electrode, so that the light emitting device 1 can be efficiently manufactured through a simple process.

In addition, the light emitting device 1 has the vertical type electrode structure, in which at least a portion of the first electrode 118 may perpendicularly overlap with the second electrode 170, so current may easily flow between the first electrode 118 and the second electrode 170, thereby improving the brightness of the light emitting device 1.

Hereinafter, the method of manufacturing the light emitting device will be described in detail with reference to FIGS. 2 to 7. In the following description, details of the elements or structures that have been previously described will be omitted in order to avoid redundancy.

Figure 3:
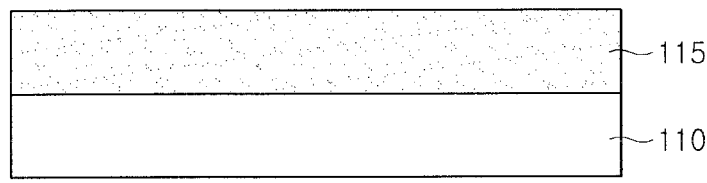
FIG. 3 is a sectional view showing a buffer layer formed on a substrate of FIG. 1.

Referring to FIG. 3, the buffer layer 115 is formed on the substrate 110. The buffer layer 115 may reduce lattice mismatch between the substrate 110 and the first semiconductor layer 130.

If the substrate 110 includes the material that reduces the lattice mismatch with respect to the first semiconductor layer 130, the buffer layer 115 can be omitted. In this case, the manufacturing cost can be reduced and the process time can be shortened.

Figure 4:
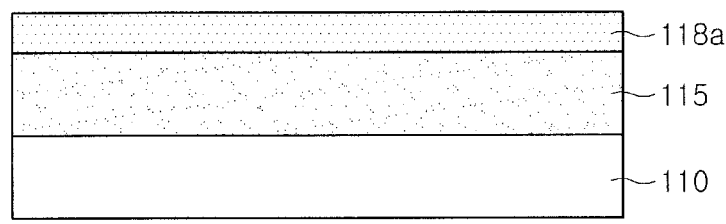
FIG. 4 is a sectional view showing a mask layer formed on buffer layer of FIG. 1.

Referring to FIG. 4, a mask layer 118a can be formed on the buffer layer 115.

The mask layer 118a can be formed on the first semiconductor layer 130 after the first semiconductor layer 130 has been formed on the buffer layer 115, or the mask layer 118a can be formed on the substrate 110 without forming the buffer layer 115, and the embodiment is not limited thereto. According to the embodiment, the mask layer 118a is formed on the buffer layer 115.

The mask layer 118a includes a material having electric conductivity. For instance, the mask layer 118a may include polysilicon, metal or an alloy, but the embodiment does not limit the material for the mask layer 118a.

The mask layer 118a can be formed through the sputtering, chemical vapor deposition (CVD), metal organic chemical vapor deposition (MOCVD), or plasma-enhanced chemical vapor deposition (PECVD) scheme, but the embodiment is not limited thereto.

Figure 5:
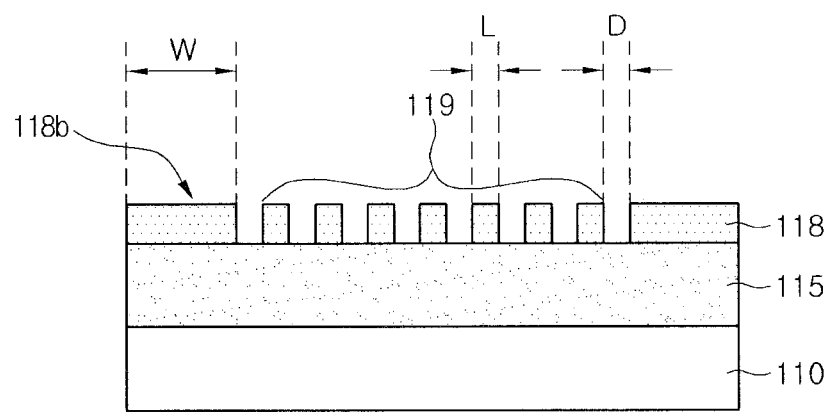
FIGS. 5 and 6 are views showing a first electrode formed by patterning a mask layer of FIG. 1.

Referring to FIGS. 5 and 6, the first electrode 118 including the perforation pattern 119 is formed by selectively removing the mask layer 118a.

For instance, the lithography process and the etching process are performed to selectively remove the mask layer 118a thereby forming the first electrode 118 including the perforation pattern 119.

The lithography process may include the photolithography process, E-beam lithography process, a laser hologram process or a deep UV stepper process, but the embodiment is not limited thereto.

The etching process may include the dry etching process or a wet etching process. The dry etching process can be performed by using ion beam or gas, such as the RIE (reactive ion etching) process or the ICP (inductively coupled plasma) process. The wet etching can be preformed by using etchant, such as HF, KOH, $H_2SO_4$, $H_2O_2$, HCl, NaOH, $NH_4OH$, or $HNO_3$, but the embodiment is not limited thereto.

The perforation pattern 119 may have various shapes. Since power is supplied to the light emitting device 1 through the first electrode 118, the perforation pattern 119 is designed such that current can be uniformly distributed over the whole area of the first electrode 118 without being concentrated onto a specific spot of the first electrode 118. In this case, the current spreading effect of the light emitting device 1 can be improved.

The perforation pattern 119 has first and second widths L and D designed to be a half or less of the wavelength of light emitted from the active layer 140.

For instance, if the active layer 140 emits blue light having the wavelength of 450 nm to 500 nm, the first and second widths L and D have a size of about 200 nm to 250 nm, respectively.

Since the perforation pattern 119 has the first and second widths L and D designed to be a half or less of the wavelength of light emitted from the active layer 140, the light incident into the perforation pattern 119 from the active layer 140 is reflected without transmitting through the buffer layer 115. Therefore, light loss can be minimized and the light reflectance can be maximized, so that the light extraction efficiency of the light emitting device 1 can be remarkably improved.

Therefore, if the perforation pattern 119 has the first and second widths L and D designed to have the size corresponding to a half or less of the wavelength of light emitted from the active layer 140, the polarizing component directed in the first direction (x) may be totally reflected from the perforation pattern 118, so that the light extraction efficiency can be remarkably improved.

The perforation pattern 119 can be formed over the whole area of the first electrode 118 except for the outer peripheral region 118b of the first electrode 118 having a third width W from an outer end of the first electrode 118.

Since the first semiconductor layer 130 must not be formed on the second region 116 of the outer peripheral region 118b, the third width W is relatively larger than that of the first and second widths L and D. For instance, the third width W has a size of about 30 μm to 50 μm.

Referring to FIG. 7, the first semiconductor layer 130 formed on the buffer layer 115 and the first electrode 118 may extend over the whole area of the first electrode 118 except for the second region 116b of the outer peripheral region 118b of the first electrode 118.

The formation of the first semiconductor layer 130 may vary depending on the shape or formation location of the perforation pattern 119, and the embodiment is not limited thereto.

Since the first semiconductor layer 130 may not be laterally grown beyond the outer peripheral region 118B having the third width W, the first semiconductor layer 130 may be formed only on a first region 116a of the outer peripheral region 118b without being formed over the whole area of the outer peripheral region 118B.

In the meantime, the perforation pattern 119 having the first and second widths L and D is located within the range of the lateral growth of the first semiconductor layer 130, the first semiconductor layer 130 may vertically grow between the first and second protrusions 120a and 120b by using the buffer layer 115 as a seed layer, and then laterally grow on the first and second protrusions 120a and 120b.

Therefore, the first semiconductor layer 130 can be formed between the first and second protrusions 120a and 120b, on the first and second protrusions 120a and 120b, and on the first region 116a of the outer peripheral region 118b. The first semiconductor layer 130 can be formed between the first and second protrusions 120a and 120b while making contact with the buffer layer 115. However, the first semiconductor layer 130 is not formed on the second region 116b of the outer peripheral region 118b.

Since the first semiconductor layer 130 is formed over the whole area of the first electrode 118 except for the second region 116b of the outer peripheral region 118b, the second region 116b of the outer peripheral region 118b of the first electrode 118 is exposed to the outside. Thus, the wire can be easily attached to the second region 116b of the outer peripheral region 118b of the first electrode 118, so that the light emitting device 1 may easily receive power through the first electrode 118.

Thus, when comparing with the case where the first electrode 118 is not formed, the defect or dislocation caused by the lattice mismatch between the first semiconductor layer 130 and the buffer layer 115 can be reduced.

In the meantime, a deposition mask can be employed to prevent the first semiconductor layer 130 from extending onto the second region 116b of the outer peripheral region 118b of the first electrode 118. In detail, after the deposition mask has been placed on the second region 116b of the outer peripheral region 118b of the first electrode 118, the first semiconductor layer 130 is grown and then the deposition mask is removed. Thus, the first semiconductor layer 130 may not be formed on the second region 116b of the outer peripheral region 118b of the first electrode 118, so that the reliability of the light emitting device 1 can be improved.

Referring to FIG. 2, the active layer 140 may be formed on the first semiconductor layer 130.

Electrons (or holes) injected through the first semiconductor layer is combined with holes (or electrons) injected through the second semiconductor layer 150 at the active layer 140, so that the active layer 140 emits the light having the wavelength corresponding a band gap according to energy band of intrinsic material of the active layer 140.

The active layer 140 may have the MQW (multiple quantum well) structure or the single quantum well structure, but the embodiment is not limited thereto.

A clad layer (not shown) doped with the n type or p type dopant can be formed on and/or under the active layer 140. The clad layer may include an AlGaN layer or an InAlGaN layer.

The second semiconductor layer 150 is formed on the active layer 140. For instance, the second semiconductor layer 150 may include a p type semiconductor layer. The p type semiconductor layer may include semiconductor material having the compositional formula of $In_xAl_yGa_{1-x-y}N$ ($1 \leq x \leq 1$, $0 \leq y \leq 1$, $0 \leq x+y \leq 1$), such as InAlGaN, GaN, AlGaN, InGaN, AlInN, AlN, or InN. In addition, the p type semiconductor layer may include p type dopant such as Mg, Zn, Ca, Sr, or Ba.

The first semiconductor layer 130, the active layer 140 and the second semiconductor layer 150 may constitute the light emitting structure.

The second electrode 170 is formed on the second semiconductor layer 150. The second electrode 170, together with the first electrode 118, supplies power to the light emitting device 1.

A transparent electrode layer (not shown) or a reflective layer (not shown) can be formed between the second semiconductor layer 150 and the second electrode 170.

The first wire 171 is connected to the second electrode 170 and the second wire 181 is connected to the second region 116b of the outer peripheral region 118b of the first electrode 118. The first and second wires 171 and 181 are connected to the external power source to supply power to the first and second electrodes 118 and 170.

The second region 116b of the outer peripheral region 118b of the first electrode 118 may have a sufficient width and a sufficient area such that the second wire 181 can be easily connected to the second region 116b.

The light emitting device 1 can receive power through the first electrode 118 without forming a separate electrode, so that the light emitting device 1 can be efficiently manufactured through a simple process.

In addition, the light emitting device 1 has the vertical type electrode structure, in which at least a portion of the first electrode 118 may perpendicularly overlap with the second electrode 170, so current may easily flow between the first electrode 118 and the second electrode 170, thereby improving the brightness of the light emitting device 1.

Further, since the first and second electrodes 118 and 170 may have the vertical type electrode structure without performing the laser lift off process to remove the substrate 110, the defect or crack caused by the laser lift off process may not occur, so that the reliability of the light emitting device 1 can be improved.

Hereinafter, a light emitting device and a method of manufacturing the light emitting device according to the second embodiment will be described. In the following description of the second embodiment, details of the elements or structures that have been previously described in the first embodiment will be omitted in order to avoid redundancy.

Figure 11:
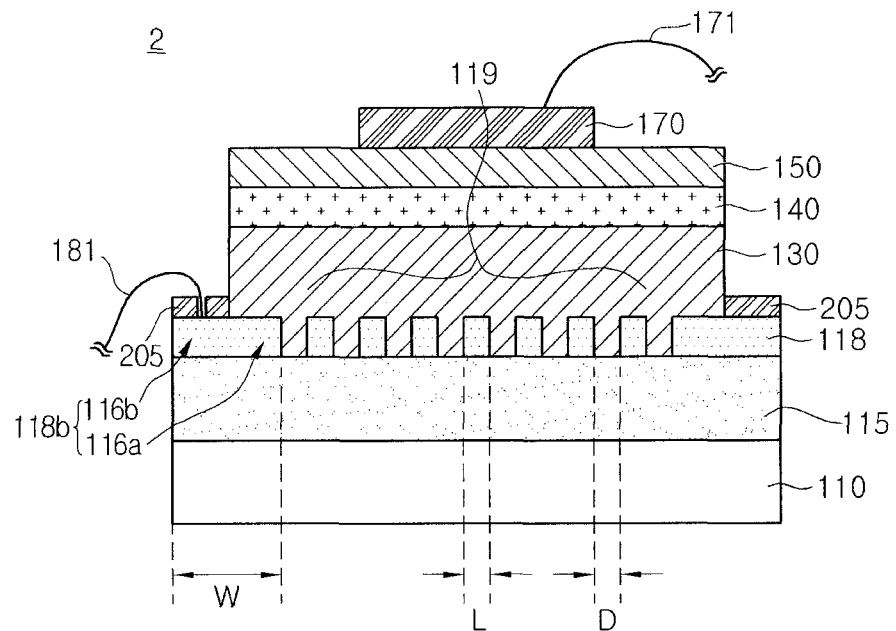
FIG. 11 is a sectional view showing a light emitting device according to the second embodiment.

FIG. 11 is a sectional view showing the light emitting device according to the second embodiment. When comparing with the light emitting device 1 of the first embodiment, the light emitting device 2 according to the second embodiment further includes an oxide layer 205 formed on a portion of the outer peripheral region 118b of the first electrode 118 exposed to the outside.

Referring to FIG. 11, the light emitting device 2 according to the second embodiment includes a substrate 110, a buffer layer 115, a first electrode 118, an oxide layer 205, a first semiconductor layer 130, an active layer 140, a second semiconductor layer 150, and a second electrode 170.

In addition to a second wire 181, the oxide layer 205 is formed on the second region 116b of the outer peripheral region 118b of the first electrode 118 exposed to the outside.

The oxide layer 205 can be formed by depositing $SiO_2$, $Si_3N_4$, $SiO_x$, $SiN_2$, $SiN_x$ or $SiO_xN_y$ through the CVD, PECVD or sputtering process, and then selectively removing the deposited layer through the lithography process, but the embodiment is not limited thereto.

The oxide layer 205 can prevent the first semiconductor layer 130 from growing onto the outer peripheral region 118b exposed to the outside. That is, the oxide layer 205 blocks the growth of the first semiconductor layer 130 a in horizontal direction such that the second wire 181 can be easily connected to the outer peripheral region 118b exposed to the outside.

In more detail, after the perforation pattern 119 has been formed on the first electrode 118, the oxide layer 205 is formed along the outer peripheral region 118b of the first electrode 118. Then, the oxide layer 205 is selectively removed through the photolithography process such that an oxide layer pattern can be formed along the outer peripheral region 118b of the first electrode 118.

Therefore, the oxide layer 205 may serve as a stopper for preventing the first semiconductor layer 130 from infiltrating into the outer peripheral region 118b of the first electrode 118.

Due to the oxide layer 205, the second wire 181 may not be directly connected to the first electrode 118. In order to connect the second wire 181 to the first electrode 118, the oxide layer 205 may be selectively patterned through the photolithography process such that the outer peripheral region 118b of the first electrode 118 can be exposed. Thus, the second wire 181 can be electrically connected to the outer peripheral region 118b of the first electrode 118 through the wire bonding process by passing through the oxide layer 205.

The patterning process for the oxide layer 205, which is performed to electrically connect the second wire 181 to the first electrode 118, may be carried out after light emitting structures 13, 14 and 150 and the second electrode 170 have been formed. Then, the first wire 171 is electrically connected to the second electrode 170 through the wire bonding process, and the second wire 181 is electrically connected to the outer peripheral region 118b of the first electrode 118 by passing through the oxide layer 205.

Hereinafter, a light emitting device and a method of manufacturing the light emitting device according to the third embodiment will be described. In the following description of the third embodiment, details of the elements or structures that have been previously described in the first embodiment will be omitted in order to avoid redundancy.

Figure 12:
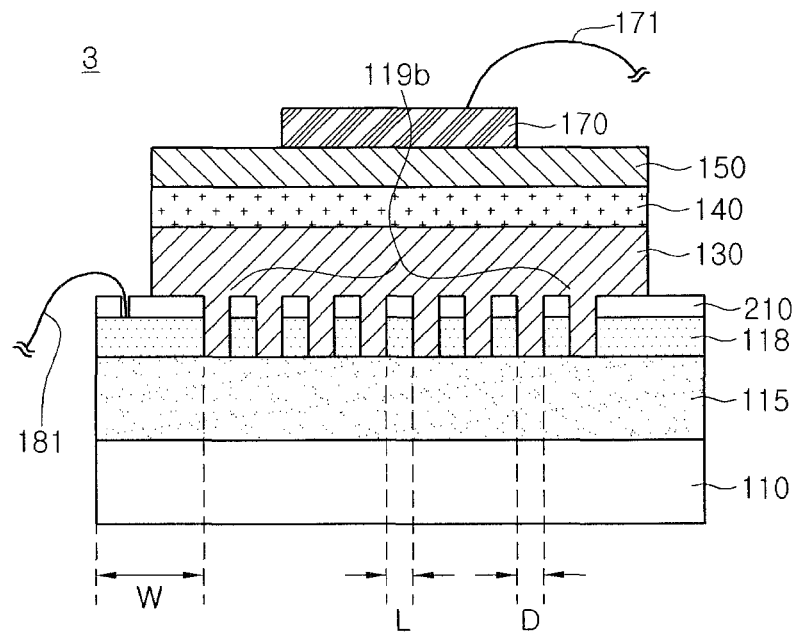
FIG. 12 is a sectional view showing a light emitting device according to the third embodiment.

FIG. 12 is a sectional view showing the light emitting device according to the third embodiment. When comparing with the light emitting device 1 of the first embodiment, the light emitting device 3 according to the third embodiment further includes a reflective layer 210 interposed between the first electrode 118 and the first semiconductor layer 130.

Referring to FIG. 12, the light emitting device 3 according to the third embodiment includes a substrate 110, a buffer layer 115, a first electrode 118, a reflective layer 210, a first semiconductor layer 130, an active layer 140, a second semiconductor layer 150, and a second electrode 170.

The reflective layer 210 is formed on the first electrode 118 to improve reflectance of light incident into the reflective layer 210 from the active layer 140, thereby enhancing the light extraction efficiency of the light emitting device 3 as compared with that of the first embodiment. The reflective layer 210 can be prepared as a single layer or a multiple layer by using one selected from the group consisting of Ag, Ni, Al, Rh, Pd, Ir, Ru, Mg, Zn, Pt, Au, Hf and an alloy thereof.

Hereinafter, a method of manufacturing the reflective layer 210 will be described.

First, after the mask layer (not shown) described in the first embodiment has been formed, a reflective film (not shown) is formed on the mask layer.

Then, the reflective film and the mask layer are selectively removed through the lithography process or the etching process, thereby forming the reflective layer 210 and the first electrode 118. In detail, after the reflective film has been patterned, the mask layer is patterned by using the patterned reflective film as a mask, thereby forming the reflective layer 210 including a perforation pattern 119b and the first electrode 118. The reflective layer 210 and the first electrode 118 may have the perforation pattern 119b having the same size. In addition, the embodiment does not limit the method of manufacturing the reflective layer 210.

The method of forming the second wire 181 can be easily understood from the second embodiment, so the detailed description thereof will be omitted.

Hereinafter, a light emitting device and a method of manufacturing the light emitting device according to the fourth embodiment will be described. In the following description of the fourth embodiment, details of the elements or structures that have been previously described in the first embodiment will be omitted in order to avoid redundancy.

Figure 13:
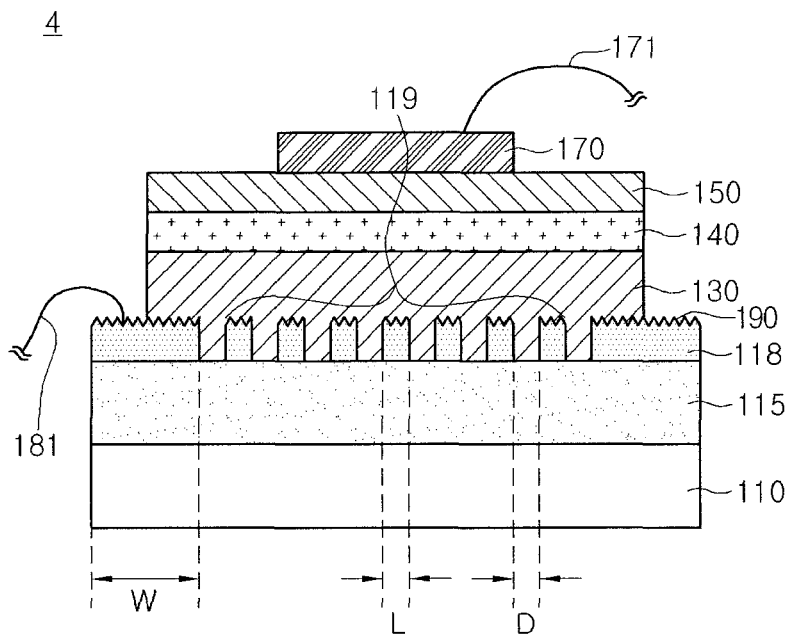
FIG. 13 is a sectional view showing a light emitting device according to the fourth embodiment.

FIG. 13 is a sectional view showing the light emitting device according to the fourth embodiment. When comparing with the light emitting device 1 of the first embodiment, the light emitting device 4 according to the second embodiment further includes a roughness or a concave-convex structure 190 formed on the top surface of the first electrode 118.

Referring to FIG. 13, the light emitting device 4 according to the fourth embodiment includes a substrate 110, a buffer layer 115, a first electrode 118, a first semiconductor layer 130, an active layer 140, a second semiconductor layer 150, and a second electrode 170.

The roughness or the concave-convex structure 190 is formed on the top surface of the first electrode 118 with a regular shape or an irregular shape. The light generated from the active layer 140 may partly be incident into the first electrode 118. In this case, since the width between the first and second protrusions 120a and 120b of the perforation pattern 119 is a half or less of the wavelength of the light emitted from the active layer 140, the light incident between the first and second protrusions 120a and 120b may be reflected. In addition, the light incident into the roughness or the concave-convex structure 190 is also reflected from the roughness or the concave-convex structure 190. The roughness or the concave-convex structure 190 may have a shape suitable for totally reflecting most of the light.

Therefore, most of the light travelling downward of the light emitting device 4 from the active layer 140 may be reflected upward, so that the light extraction efficiency of the light emitting device 4 can be remarkably improved.

Hereinafter, a light emitting device and a method of manufacturing the light emitting device according to the fifth embodiment will be described. In the following description of the fifth embodiment, details of the elements or structures that have been previously described in the first embodiment will be omitted in order to avoid redundancy.

Figure 14:
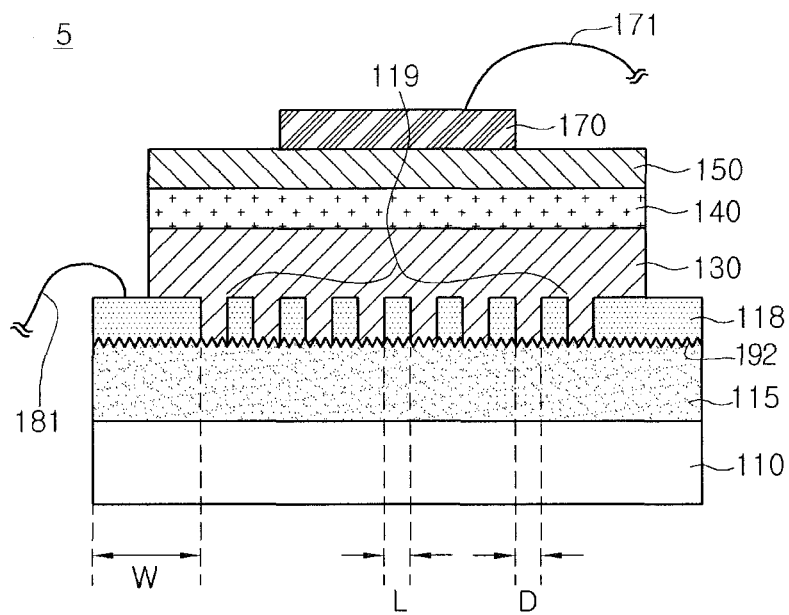
FIG. 14 is a sectional view showing a light emitting device according to the fifth embodiment.

FIG. 14 is a sectional view showing the light emitting device according to the fifth embodiment. When comparing with the light emitting device 1 of the first embodiment, the light emitting device 5 according to the fifth embodiment further includes a roughness or a concave-convex structure 192 formed on the top surface of a buffer layer 115.

Referring to FIG. 14, the light emitting device 5 according to the fifth embodiment includes a substrate 110, the buffer layer 115, a first electrode 118, a first semiconductor layer 130, an active layer 140, a second semiconductor layer 150, and a second electrode 170.

The roughness or the concave-convex structure 192 can be formed on the top surface of the buffer layer 115 with a regular shape or an irregular shape. The light generated from the active layer 140 is partly incident into the first electrode 118. In this case, since the width between the first and second protrusions of the perforation pattern 119 is a half or less of the wavelength of the light emitted from the active layer 140, the polarizing component of the light incident between the first and second protrusions 120a and 120b and directed in the first direction (x) perpendicularly to the length direction of the first and second protrusions 120a and 120b may be reflected.

Nevertheless of the perforation pattern 119, the polarizing component of the light directed in the second direction (y) parallel to the length direction of the first and second protrusions 120a and 120b may proceed to the buffer layer 115 through gaps formed between the first and second protrusions 120a and 120b.

In this case, the polarizing component of the light directed in the second direction (y) may be reflected from the roughness or the concave-convex structure 192 formed on the top surface of the buffer layer 115.

Therefore, the polarizing component of the light emitted from the active layer 140 and directed in the first direction (x) may be reflected from the first and second protrusions 120a and 120b, and the polarizing component of the light directed in the second direction (y) may be reflected from the roughness or the concave-convex structure 192, so that the light extraction efficiency of the light emitting device 5 can be remarkably improved.

In addition, the roughness or the concave-convex structure 192 is securely fixed to the buffer layer 115 to assist the growth of the first semiconductor layer 130.

Hereinafter, a light emitting device and a method of manufacturing the light emitting device according to the sixth embodiment will be described. In the following description of the sixth embodiment, details of the elements or structures that have been previously described in the first embodiment will be omitted in order to avoid redundancy.

Figure 15:
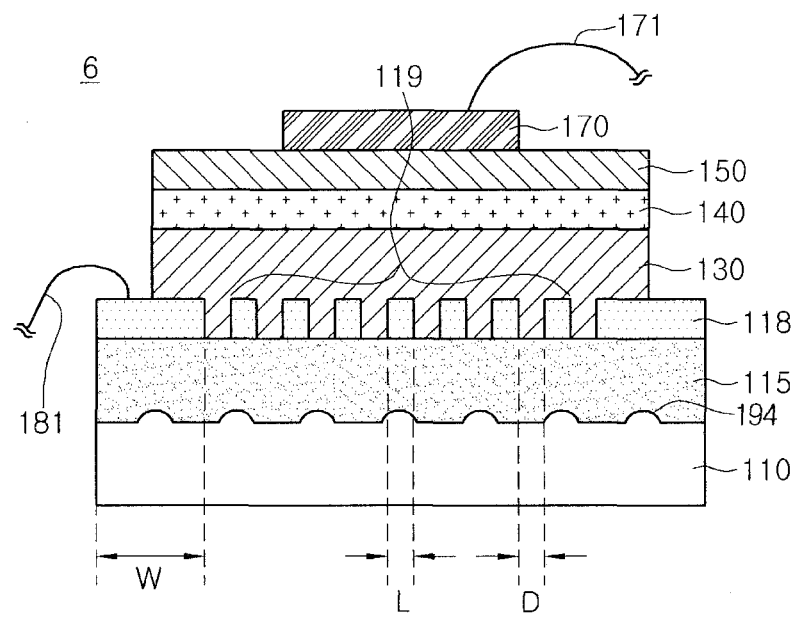
FIG. 15 is a sectional view showing a light emitting device according to the sixth embodiment.

FIG. 15 is a sectional view showing the light emitting device according to the sixth embodiment. When comparing with the light emitting device 1 of the first embodiment, the light emitting device 6 according to the sixth embodiment further includes a plurality of convex protrusions 194 formed on the top surface of a substrate 110.

Referring to FIG. 15, the light emitting device 6 according to the sixth embodiment includes the substrate 110, a buffer layer 115, a first electrode 118, a first semiconductor layer 130, an active layer 140, a second semiconductor layer 150, and a second electrode 170.

The convex protrusions 194 can be formed on the top surface of the substrate 110 with a regular shape or an irregular shape. Although not shown in FIG. 15, concave protrusions can be formed on the substrate 110 with a regular shape or an irregular shape. The embodiment may not limit the shape of the protrusions or recesses.

The convex protrusions 194 can be formed by performing the dry etching process or the wet etching process with respect to the substrate 110. In addition, after a base layer including a material different from that of the substrate 110 has been formed, the dry etching process or the wet etching process can be performed with respect to the base layer to form the convex protrusions 194 on the substrate 110.

The convex protrusions 194 may be rounded or angularly formed, but the embodiment is not limited thereto.

The light generated from the active layer 140 may partly be incident into the first electrode 118. In this case, since the width between the first and second protrusions of the perforation pattern 119 is a half or less of the wavelength of the light emitted from the active layer 140, the light incident between the first and second protrusions and directed in the first direction (x) perpendicularly to the length direction of the first and second protrusions may be reflected.

Nevertheless of the perforation pattern 119, the polarizing component of the light directed in the second direction (y) parallel to the length direction of the first and second protrusions may proceed to the buffer layer 115 or the substrate 110 through gaps formed between the first and second protrusions 120a and 120b.

In this case, the polarizing component of the light directed in the second direction (y) may be randomly reflected from the convex protrusions 194 formed on the top surface of the buffer layer substrate 110.

Therefore, the polarizing component of the light emitted from the active layer 140 and directed in the first direction (x) may be reflected from the first and second protrusions 120a and 120b, and the polarizing component of the light directed in the second direction (y) may be reflected from the convex protrusions 194 formed on the substrate 110, so that the light extraction efficiency of the light emitting device 6 can be remarkably improved.

Hereinafter, a light emitting device and a method of manufacturing the light emitting device according to the seventh embodiment will be described. In the following description of the seventh embodiment, details of the elements or structures that have been previously described in the first embodiment will be omitted in order to avoid redundancy.

Figure 16:
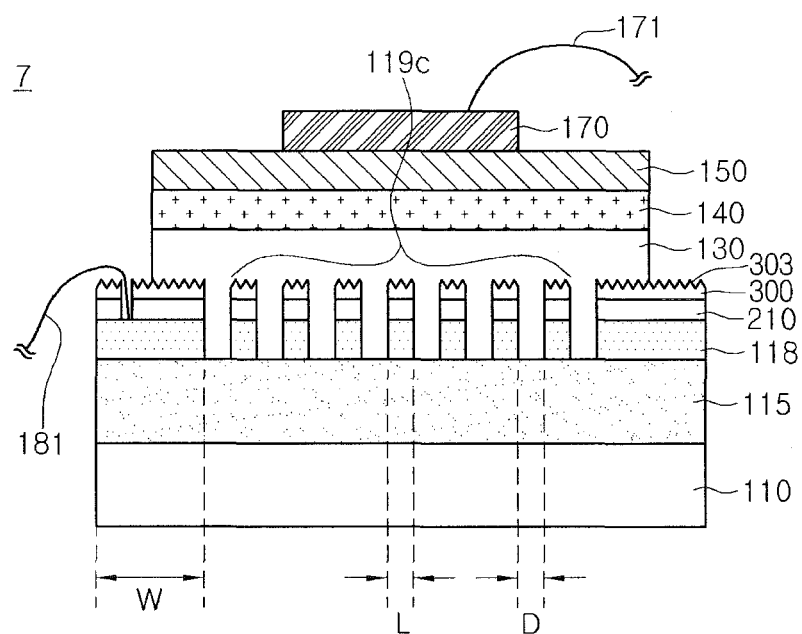
FIG. 16 is a sectional view showing a light emitting device according to the seventh embodiment.

FIG. 16 is a sectional view showing the light emitting device according to the seventh embodiment. When comparing with the light emitting device 3 of the third embodiment, the light emitting device 7 according to the seventh embodiment further includes an ohmic contact layer 300 formed on a reflective layer 210 and a roughness or a concave-convex structure 303 formed on the ohmic contact layer 300.

Referring to FIG. 16, the light emitting device 7 according to the seventh embodiment includes a substrate 110, a buffer layer 115, a first electrode 118, the reflective layer 210, the ohmic contact layer 300, a first semiconductor layer 130, an active layer 140, a second semiconductor layer 150, and a second electrode 170.

The roughness or the concave-convex structure 303 may be formed on the top surface of the ohmic contact layer 300 with a regular shape or an irregular shape.

The ohmic contact layer 300 may have a perforation pattern 119c identical to a perforation pattern 119c of the first electrode 118 and the reflective layer 210. In other words, the first electrode 118, the reflective layer 210, and the ohmic contact layer 300 may commonly share the same perforation pattern 119c. To this end, the reflective layer 210 and the ohmic contact layer are sequentially formed on the first electrode 118. Then, the ohmic contact layer 300, the reflective layer 210, and the first electrode 118 are removed through the wet etching process or the dry etching process such that the buffer layer 115 can be exposed, thereby forming the first electrode 118, the reflective layer 210, and the ohmic contact layer 300 having the same perforation pattern 119c.

The roughness or the concave-convex structure 303 can be formed on the ohmic contact layer 300. The concave-convex structure 303 can be formed after or before the perforation pattern 119c has been formed. The embodiment does not limit the formation order for the roughness or the concave-convex structure 303.

The ohmic contact layer 300 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (aluminum tin oxide) and GZO (gallium zinc oxide).

The ohmic contact layer 300 is formed to minimize the ohmic contact resistance between the first electrode 118 and the first semiconductor layer 130 and between the reflective layer 210 and the first semiconductor layer 130.

When the roughness or the concave-convex structure 303 is formed on the ohmic contact layer 300, a portion of the light generated from the active layer 140 may be incident into the perforation pattern 119c. In this case, since the width between the first and second protrusions 120a and 120b of the perforation pattern 119c is a half or less of the wavelength of the light emitted from the active layer 140, the light incident between the first and second protrusions may be reflected. In addition, the light incident into the roughness or the concave-convex structure 303 is also reflected from the roughness or the concave-convex structure 303. The roughness or the concave-convex structure 303 may have a shape suitable for totally reflecting most of the light.

Therefore, most of the light travelling downward of the light emitting device 7 from the active layer 140 may be reflected upward, so that the light extraction efficiency of the light emitting device 7 can be remarkably improved.

In the meantime, the current spreading effect of the light emitting device 7 can be improved due to the roughness or the concave-convex structure 303 formed on the ohmic contact layer 300.

Figure 17:
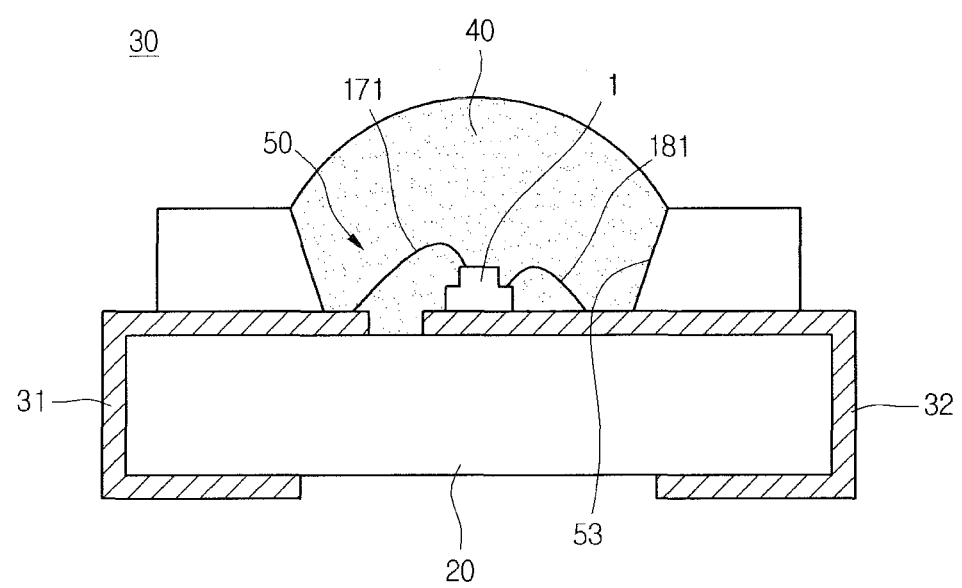
FIG. 17 is a sectional view showing a light emitting device package including a light emitting device according to the embodiment.

FIG. 17 is a sectional view showing a light emitting device package including the light emitting device according to the embodiments.

Referring to FIG. 17, the light emitting device package 30 includes a body 20, first and second electrode layers 31 and 32 formed on the body 20, the light emitting device 1 provided on the body 20 and electrically connected to the first and second electrode layers 31 and 32 and a molding member 40 that surrounds the light emitting device 1.

The body 20 may include silicon, synthetic resin or metallic material. When viewed from the top, the body 20 has a cavity 50 formed with an inclined inner wall 53.

The first and second electrode layers 31 and 32 are electrically isolated from each other and formed by passing through the body 20.

In detail, one ends of the first and second electrode layers 31 and 32 are disposed in the cavity 50 and the other ends of the first and second electrode layers 31 and 32 are attached to an outer surface of the body 20 and exposed to the outside.

The first and second electrode layers 31 and 32 supply power to the light emitting device and improve the light efficiency by reflecting the light emitted from the light emitting device 1. Further, the first and second electrode layers 31 and 32 dissipate heat generated from the light emitting device 1 to the outside.

The light emitting device 1 can be installed on the body 20 or the first or second electrode layer 31 or 32.

The wires 171 and 181 of the light emitting device 1 can be electrically connected to one of the first and second electrode layers 31 and 32, but the embodiment is not limited thereto.

The molding member 40 surrounds the light emitting device 1 to protect the light emitting device 1. In addition, the molding member 40 may include phosphors to change the wavelength of the light emitted from the light emitting device 1.

Figure 18:
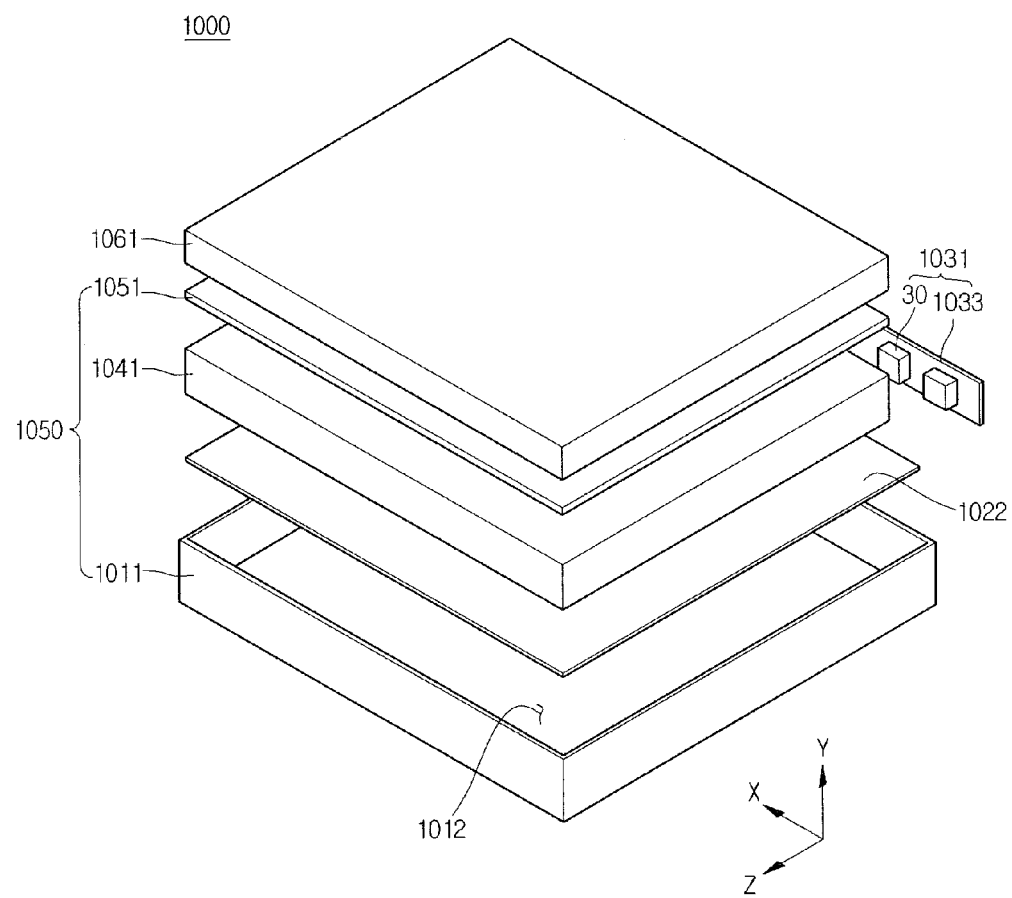
FIG. 18 is an exploded perspective view of a display device according to the embodiment.
Figure 19:
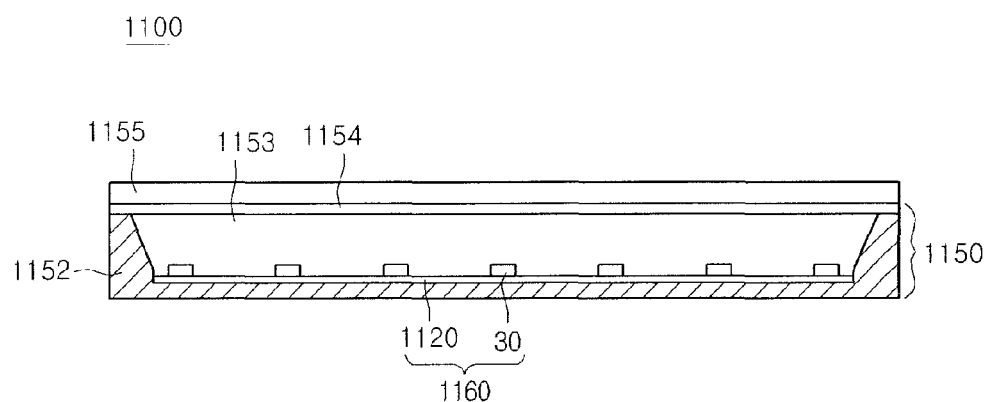
FIG. 19 is a sectional view showing a display device according to the embodiment.
Figure 20:
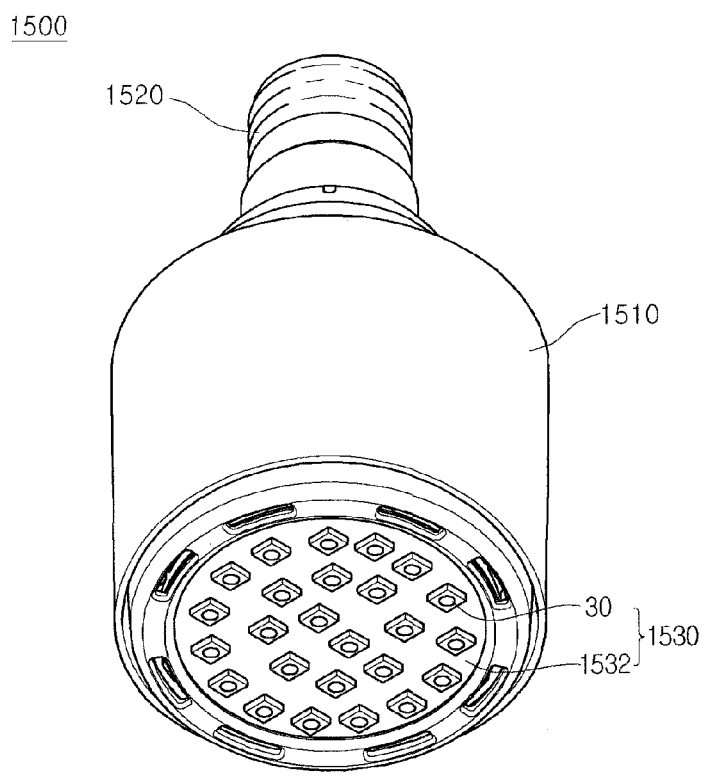
FIG. 20 is a perspective view showing a lighting device according to the embodiment.

The light emitting device or the light emitting device package according to the embodiment can be applied to the light unit. The light unit includes a plurality of light emitting devices or a plurality of light emitting device packages. The light unit may include the display device as shown in FIGS. 18 and 19 and the lighting device as shown in FIG. 20. In addition, the light unit may include a lighting lamp, a signal lamp, a headlight of a vehicle, and an electric signboard.

FIG. 18 is an exploded perspective view showing the display device according to the embodiment.

Referring to FIG. 18, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is travelled downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 19 is a sectional view showing a display device according to the embodiment.

Referring to FIG. 19, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 20 is a perspective view showing a lighting device according to the embodiment.

Referring to FIG. 20, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the perforation pattern, which is formed through the top and bottom surface of the first electrode, is formed on the first substrate, so the defect or the dislocation caused by the lattice mismatch between the first semiconductor layer and the buffer layer can be minimized.

According to the embodiment, the perforation pattern includes first and second protrusions alternately arranged with each other, and the width of the first and second protrusions is set corresponding to a half or less of the wavelength of the light emitted from the active layer and the interval between the first and second protrusions is set corresponding to a half or less of the wavelength of the light emitted from the active layer, so that the light is totally reflected from the perforation pattern, thereby remarkably improving the light efficiency.

According to the embodiment, the first semiconductor layer is formed on the perforation pattern and on a portion of the outer peripheral region of the first electrode without being formed on the remaining portion of the outer peripheral region of the first electrode, so the wire can be easily connected to the remaining portion of the outer peripheral region of the first electrode where the first semiconductor layer is not formed.

According to the embodiment, a plurality of wires are connected to the remaining portion of the outer peripheral region of the first electrode where the first semiconductor layer is not formed, so the power can be easily supplied to the first electrode.

According to the embodiment, the oxide layer is formed on the remaining portion of the outer peripheral region of the first electrode, so the first semiconductor layer may not extend to the remaining portion of the outer peripheral region of the first electrode.

According to the embodiment, the perforation pattern has various shapes, so that defect caused by lattice mismatch can be minimized and the light efficiency can be maximized.

According to the embodiment, the first electrode includes polysilicon having the advantages of high electric conductivity, high melting point (1400° C. or above), oxidative stability, low-temperature stability and fire-resistant property, so the advantages of the polysilicon can be optimally utilized in the process.

According to the embodiment, the reflective layer is formed between the first electrode and the first semiconductor layer, so that the light extraction efficiency can be remarkably improved by the reflective layer as well as the perforation pattern.

According to the embodiment, the reflective layer has the perforation pattern the same as that of the first electrode, so that the process can be simplified.

According to the embodiment, the light emitting device package employing the light emitting device can be utilized for the display device or the lighting device, so that the product may have high brightness and low current consumption.

Meanwhile, the method of manufacturing the light emitting device includes the steps of forming the mask layer on the substrate, forming the electrode including the perforation pattern formed through the top and bottom surfaces of the electrode by selectively removing the mask layer, forming the first semiconductor layer on a portion of the outer peripheral region of the electrode and the perforation pattern, forming the active layer on the first semiconductor layer, and forming the second semiconductor layer on the active layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a buffer layer over the substrate;
   an electrode including a perforation pattern through top and bottom surfaces of the electrode over the buffer layer;
   a first semiconductor layer over the electrode;
   an active layer over the first semiconductor layer;
   a second semiconductor layer over the active layer; and
   an ohmic contact layer at least between the perforation pattern of the electrode and the first semiconductor layer, wherein the ohmic contact layer has a perforation pattern that is substantially same as the perforation pattern of the electrode.

2. The light emitting device of claim 1, wherein the perforation pattern includes:
   a plurality of first protrusions extending from one side of the perforation pattern toward an opposite side of the perforation pattern; and
   a plurality of second protrusions extending from the opposite side of the perforation pattern toward the one side of the perforation pattern and disposed between the plurality of first protrusions.

3. The light emitting device of claim 2, wherein:
   the electrode further includes an outer peripheral region having a first region adjacent to the perforation pattern and a second region adjacent to a side end of the electrode, the first semiconductor layer is between the first and second protrusions, on the first and second protrusions, and on the first region of the outer peripheral region, and
   the outer peripheral region is disposed along an edge region of a bottom surface of the first semiconductor layer.

4. The light emitting device of claim 3, further comprising: an oxide layer on the second region of the outer peripheral region.

5. The light emitting device of claim 4, further comprising at least one wire contacting the second region of the electrode by passing through the oxide layer.

6. The light emitting device of claim 3, wherein a width between the first and second protrusions is about 0.4% to about 0.9% with respect to a width of the outer peripheral region.

7. The light emitting device of claim 3, further comprising at least one wire contacting the second region of the outer peripheral region.

8. The light emitting device of claim 2, wherein a width between the first and second protrusions is a half or less of a wavelength of light from the active layer.

9. The light emitting device of claim 1, wherein the perforation pattern includes a plurality of dots arranged in a dot matrix, and wherein each dot is through top and bottom surfaces of the electrode.

10. The light emitting device of claim 1, wherein the perforation pattern is in a spiral pattern between a center of the electrode and the outer peripheral region of the electrode, and wherein the spiral pattern is through top and bottom surface of the electrode.

11. The light emitting device of claim 1, wherein the electrode includes at least one of polysilicon, a metal or an alloy.

12. The light emitting device of claim 11, wherein the alloy includes at least one of $TiSi_2$ or $WSi_2$.

13. The light emitting device of claim 1, further comprising a reflective layer between the first semiconductor layer and the electrode.

14. The light emitting device of claim 13, wherein the reflective layer includes a perforation pattern that is substantially same as the perforation pattern of the electrode.

15. The light emitting device of claim 13, wherein a top surface of the ohmic contact layer includes a concave-convex structure.

16. The light emitting device of claim 1, wherein a top surface of the electrode includes a concave-convex structure.

17. The light emitting device of claim 1, wherein a top of the buffer layer includes a concave-convex structure.

18. The light emitting device of claim 1, wherein a top surface of the substrate includes a plurality of protrusions.

19. A light emitting device comprising:
a substrate;
a buffer layer over the substrate;
an electrode including a perforation pattern through top and bottom surfaces of the electrode over the buffer layer;
a first semiconductor layer over the electrode;
an active layer over the first semiconductor layer; and
a second semiconductor layer over the active layer, wherein the perforation pattern comprises:
a plurality of first protrusions extending from one side of the perforation pattern toward an opposite side of the perforation pattern; and
a plurality of second protrusions extending from the opposite side of the perforation pattern toward the one side of the perforation pattern and disposed between the plurality of first protrusions, and wherein a width between the first and second protrusions is a half or less of a wavelength of light from the active layer.

20. A light emitting device package comprising:
a body;
first and second electrode layers over the body;
a light emitting device electrically connected to the first and second electrodes over the body; and
a molding member surrounding the light emitting device over the body,
wherein the light emitting device comprises:
a buffer layer over a substrate;
an electrode including a perforation pattern through top and bottom surfaces of the electrode over the buffer layer;
a first semiconductor layer over the electrode;
an active layer over the first semiconductor layer;
a second semiconductor layer over the active layer, and wherein the perforation pattern comprises:
a plurality of first protrusions extending from one side of the perforation pattern toward an opposite side of the perforation pattern; and
a plurality of second protrusions extending from the opposite side of the perforation pattern toward the one side of the perforation pattern and disposed between the plurality of first protrusions.

* * * * *